(12) United States Patent  
Ueta

(10) Patent No.: US 12,193,250 B2  
(45) Date of Patent: Jan. 7, 2025

(54) LIGHT EMITTING ELEMENT AND DISPLAY DEVICE INCLUDING AN ELECTRON TRANSPORT LAYER CONTAINING AT LEAST ONE OF RH AND IR

(71) Applicant: SHARP KABUSHIKI KAISHA, Sakai (JP)

(72) Inventor: Yoshihiro Ueta, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 402 days.

(21) Appl. No.: 17/612,435

(22) PCT Filed: May 31, 2019

(86) PCT No.: PCT/JP2019/021677  
§ 371 (c)(1),  
(2) Date: Nov. 18, 2021

(87) PCT Pub. No.: WO2020/240807  
PCT Pub. Date: Dec. 3, 2020

(65) Prior Publication Data  
US 2022/0223809 A1  Jul. 14, 2022

(51) Int. Cl.  
*H10K 50/16* (2023.01)  
*H10K 50/115* (2023.01)

(52) U.S. Cl.  
CPC ........... *H10K 50/115* (2023.02); *H10K 50/16* (2023.02)

(58) Field of Classification Search  
CPC .... H10K 50/115; H10K 50/16; H10K 50/165; H10K 50/166  
See application file for complete search history.

(56) References Cited

U.S. PATENT DOCUMENTS

| | | |
|---|---|---|
| 2007/0103068 A1 | 5/2007 | Bawendi et al. |
| 2012/0238047 A1 | 9/2012 | Bawendi et al. |
| 2012/0292595 A1 | 11/2012 | Bawendi et al. |
| 2017/0125635 A1 | 5/2017 | Bawendi et al. |
| 2019/0036034 A1* | 1/2019 | Akashi ................. C07F 7/30 |
| 2019/0131557 A1* | 5/2019 | Lee ................. H10K 85/1135 |
| 2019/0348614 A1* | 11/2019 | Duan ................ H10K 85/6576 |
| 2020/0227663 A1* | 7/2020 | Kim ................... H10K 50/15 |
| 2022/0194969 A1* | 6/2022 | Lee ....................... C09K 11/02 |

FOREIGN PATENT DOCUMENTS

JP  2012-023388 A  2/2012

* cited by examiner

*Primary Examiner* — Daniel Whalen  
(74) *Attorney, Agent, or Firm* — ScienBiziP, P.C.

(57) ABSTRACT

A light-emitting element includes a positive electrode, a negative electrode, a quantum dot layer provided between the positive electrode and the negative electrode and including quantum dots, and a first electron transport layer provided in contact with the quantum dot layer between the quantum dot layer and the negative electrode and containing a compound having a composition of ZnMO, constituent elements M in the composition being an element of at least one of Co, Rh, and Ir.

1 Claim, 5 Drawing Sheets

| MATERIAL | ELECTRON AFFINITY (eV) | IONIZATION POTENTIAL (eV) |
|---|---|---|
| BaO | 1.25 | 1.8 |
| SrO | 1.43 | 6.5 |
| CaO | 1.78 | 8.8 |
| $LaB_6$ | 2.69 | 1.4 |
| TiC | 3.32 | 4.5 |
| ZrC | 3.38 | 5.4 |
| HfC | 3.40 | 6.6 |
| NdC | 3.45 | 6.8 |
| TaC | 3.61 | 7.2 |

|  | CONSTITUENT ELEMENT M | EXAMPLES ||||||||||| COMPARATIVE EXAMPLE |
|  |  | 1-1 | 1-2 | 1-3 | 1-4 | 1-5 | 1-6 | 1-7 | 1-8 | 1-9 | 1-10 | 1-11 |  |
| RATIO OF MATERIAL (%) | ZnM$_2$O$_4$ Ir | — | 100 | — | 50 | 50 | — | 35 | 50 | 50 | — | 35 | — |
|  | ZnM$_2$O$_4$ Rh | 100 | — | — | 50 | — | 50 | 30 | 50 | — | 50 | 30 | — |
|  | ZnM$_2$O$_4$ Co | — | — | 100 | — | 50 | 50 | 35 | — | 50 | 50 | 35 | — |
|  | ZnO | — | — | — | — | — | — | — | — | — | — | — | 100 |
| ELECTRON AFFINITY (eV) |  | 2.50 | 2.60 | 2.40 | 2.55 | 2.50 | 2.45 | 2.52 | 2.45 | 2.30 | 2.26 | 2.32 | 3.80 |
| IONIZATION POTENTIAL (eV) |  | 5.6 | 5.1 | 6.6 | 5.2 | 6.5 | 6.6 | 5.3 | 5.3 | 5.8 | 6.0 | 6.2 | 7.0 |

FIG. 5

LIGHT EMITTING ELEMENT AND DISPLAY DEVICE INCLUDING AN ELECTRON TRANSPORT LAYER CONTAINING AT LEAST ONE OF RH AND IR

TECHNICAL FIELD

The disclosure relates to a light-emitting element and a display device.

BACKGROUND ART

The light-emitting element described in PTL 1 includes an electron transport layer between a quantum dot layer and a positive electrode.

CITATION LIST

Patent Literature

PTL 1: JP 2012-23388 A

SUMMARY OF INVENTION

Technical Problem

In the light-emitting element of PTL 1, a difference in the electron affinity between the quantum dot layer and the electron transport layer increases depending on a material of the quantum dot layer. As a result, a barrier to electrons heading from the electron transport layer towards the quantum dot layer increases. Accordingly, electrons are less likely to be injected from the electron transport layer to the quantum dot layer, and the electron density in the quantum dot layer decreases. As a result, recombination rate between electrons and positive holes in the quantum dot layer decreases, and luminous efficiency (external quantum efficiency) of the light-emitting element decreases.

An object of the light-emitting element according to an aspect of the disclosure is to increase the luminous efficiency of the light-emitting element by reducing the barrier to electrons between the electron transport layer and the quantum dot layer.

Solution to Problem

A light-emitting element according to an embodiment of the disclosure includes a positive electrode, a negative electrode, a quantum dot layer provided between the positive electrode and the negative electrode and including quantum dots, and a first electron transport layer provided in contact with the quantum dot layer between the quantum dot layer and the negative electrode and containing a compound having a composition of ZnMO, constituent elements M in the composition being elements of at least one of Co, Rh, and Ir.

Advantageous Effects of Disclosure

According to a light-emitting element according to an aspect of the disclosure, luminous efficiency of the light-emitting element can be increased by reducing a barrier to electrons between an electron transport layer and a quantum dot layer.

BRIEF DESCRIPTION OF DRAWINGS

FIG. 5 is a table showing compositions and characteristic values of light-emitting elements according to respective examples and a comparative example.

DESCRIPTION OF EMBODIMENTS

Hereinafter, exemplary embodiments and examples of the disclosure will be described with reference to the drawings. Note that duplicate items in each of the embodiments and the examples are omitted as appropriate. In the following, descriptions of upper and lower correspond to those in each drawing.

First Embodiment

Figure 1:
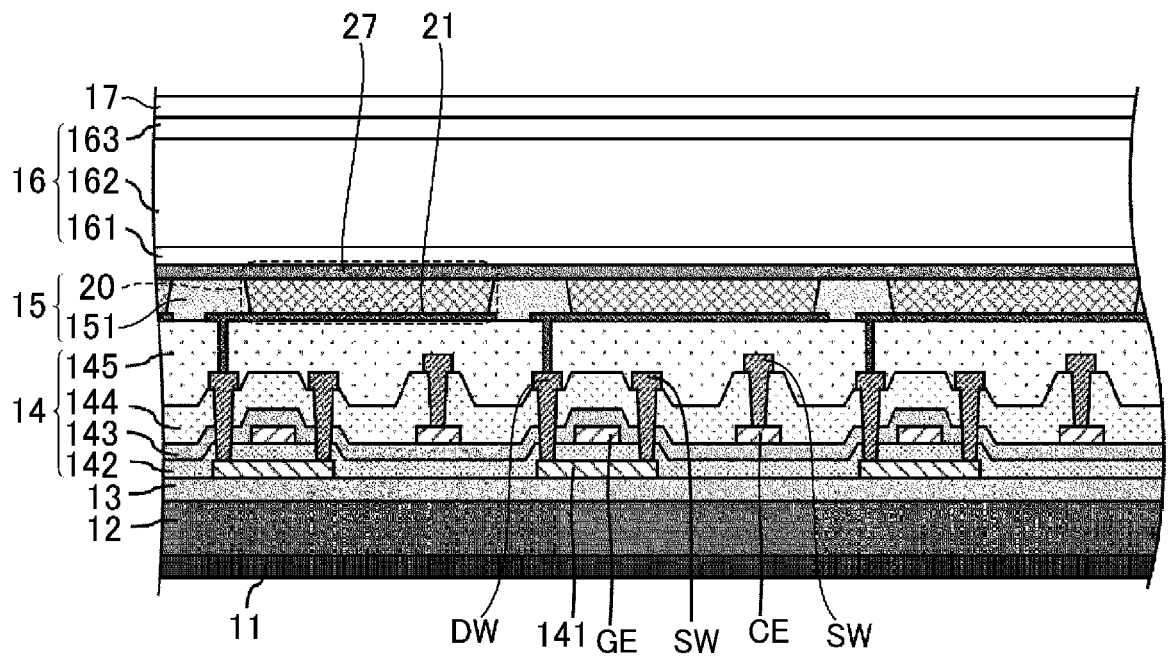
FIG. 1 is a schematic cross-sectional view illustrating a display device of the disclosure.

FIG. 1 is a cross-sectional view schematically illustrating a display device 10 including a light-emitting element 20 according to a first embodiment. The display device 10 of the present embodiment is a quantum-dot light emitting diode (QLED) panel in which the light-emitting elements 20 including quantum dots are provided on a first film 11 having flexibility and a resin layer 12.

The display device 10 has a structure in which the resin layer 12, a barrier layer 13, a thin film transistor layer 14 (hereinafter, thin film transistor is referred to as TFT) including TFTs, a light-emitting element layer 15 including the light-emitting elements 20 and cover films 151, a sealing layer 16, and a second film 17 are layered in this order on the first film 11, as illustrated in FIG. 1.

The first film 11 is a support member in the display device 10 having flexibility. The first film 11 can be formed of a material having flexibility such as PET. Note that in a case where the display device 10 is configured to have no flexibility, a substrate formed of a hard material such as glass may be used instead of the first film 11.

The resin layer 12 is provided between the first film 11 and the barrier layer 13. The resin layer 12 is a layer for partially removed when a support substrate (not illustrated) is peeled from the barrier layer 13. The resin layer 12 can be formed of, for example, a resin material such as polyimide. Note that the resin layer 12 may have a multilayer structure in which a plurality of resin films are layered, or may have a multi-layer structure in which an inorganic film is interposed between the plurality of resin films. Note that in the case in which the display device 10 is configured to have no flexibility, the resin layer 12 need not be provided.

The barrier layer 13 is a layer for preventing foreign matters such as water and oxygen from entering the TFT layer 14 and the light-emitting element layer 15. The barrier layer 13 is a single layer or a multi-layer insulating film, and can be formed of an insulating material, such as silicon oxide, silicon nitride, or silicon oxynitride.

The TFT layer 14 includes a semiconductor film 141, a gate insulating film 142 above the semiconductor film 141, a gate electrode GE and a gate wiring line (not illustrated) above the gate insulating film 142, a first insulating film 143 above the gate electrode GE and the gate wiring line, a capacitance electrode CE above the first insulating film 143, a second insulating film 144 above the capacitance electrode CE, a source wiring line SW and a drain wiring line DW (not illustrated) above the second insulating film 144, and a flattening film 145 above the source wiring line SW and the drain wiring line DW.

The TFT includes the semiconductor film 141, the gate insulating film 142, the gate electrode GE, the first insulating film 143, and the second insulating film 144. A source region and a drain region (not illustrated) of the semiconductor film 141 are regions in which high concentration doping is performed on an upper face of the semiconductor film 141, and function as a source electrode and a drain electrode. The source wiring line SW and the drain wiring line DW are connected to the source region and the drain region, respectively via contact holes passing through the gate insulating film 142, the first insulating film 143, and the second insulating film 144. The gate electrode GE is connected to a gate wiring line (not illustrated).

The semiconductor film 141 can be formed of, for example, a semiconductor material such as low-temperature polysilicon (LTPS) or an oxide semiconductor (for example, an In—Ga—Zn—O based semiconductor). The gate electrode GE, the gate wiring line, the capacitance electrode CE, the drain wiring line DW, and the source wiring line SW are single layer or multi-layer conductive films, and can be formed of a metal material such as Al, W, Mo, Ta, Cr, Ti, or Cu.

The first insulating film 143 and the second insulating film 144 are single layer or multi-layer insulating films, and can be formed of an insulating material, such as silicon oxide or silicon nitride.

The flattening film 145 is a film layered on the TFT for flattening irregularities formed by the TFT. The flattening film 145 can facilitate layering the light-emitting element 15 thereon. The flattening film 145 can be formed of, for example, an organic material such as polyimide and acrylic.

Note that although a structure of the TFT included in the TFT layer 14 is illustrated as a top gate type in FIG. 1, the structure of the TFT may be a bottom gate type or a double gate type. The TFT is a switching element that controls light emission of the light-emitting element 20. One TFT is connected to one light-emitting element 20. In FIG. 1, the drain region of the TFT and a positive electrode 21 of the light-emitting element 20 are connected to each other via the contact hole formed in the flattening film 145 and the drain wiring line DW provided in the TFT layer 14.

The light-emitting element layer 15 includes a plurality of the light-emitting elements 20 and the cover films 151. The plurality of light-emitting elements 20 is arranged in a matrix in a display region of an image in the display device 10. Note that FIG. 1 illustrates a structure in which the plurality of light-emitting elements 20 shares one negative electrode 27. However, the shape of the negative electrode 27 is not limited thereto. For example, a structure may be such that each light-emitting element 20 has a separate negative electrode 27. FIG. 1 illustrates a structure in which each light-emitting element 20 has a separate positive electrode 21. However, the shape of the positive electrode 21 is not limited thereto. For example, a structure may be such that the plurality of light-emitting elements 20 shares one positive electrode 21.

The cover films 151 are provided between the plurality of light-emitting elements 20 so as to cover a side surface of each light-emitting element 20 and an edge of each positive electrode 21. The cover film 151 is provided in a lattice pattern in the display region. The cover film 151 is an insulating film, and can be formed of an organic material such as polyimide or acrylic.

The sealing layer 16 is a layer for sealing the light-emitting element layer 15 to prevent foreign matters such as water and oxygen from entering the TFT layer 14 and the light-emitting element layer 15. FIG. 1 illustrates a case in which the sealing layer 16 has a three-layer structure including a first sealing film 161 covering the negative electrode 27, a second sealing film 162 covering the first sealing film 161, and a third sealing film 163 covering the second sealing film 162. However, the sealing layer 16 is not limited to the three-layer structure. For example, the sealing layer 16 may have a structure of any number of layers including a single layer.

For example, the first sealing film 161 and the third sealing film 163 are single layer or multi-layer inorganic insulating films, and can be formed of an inorganic material such as a silicon oxide film, a silicon nitride film, and a silicon oxynitride film. The second sealing film 162 is, for example, a transparent organic film, and can be formed of a transparent organic material such as acrylic.

The second film 17 can be formed of, for example, a PET film. As a result, the display device 10 having flexibility can be realized. Note that in the case where the display device 10 has no flexibility, a substrate formed of a hard material such as glass may be used instead of the second film 17.

Among the first film 11 and the second film 17, for a film provided on a side from which light emitted from the light-emitting element 20 is output in other words a film provided on a side to be the display region of the display device 10, a function film having, for example, an optical compensation function, a touch sensor function, and a protection function can be used.

The light-emitting element 20 of the present embodiment illustrates a configuration in which light is output from the positive electrode 21 side among the positive electrode 21 and the negative electrode 27 to the outside of the display device 10. Thus, in the configuration of the display device 10, the first film 11, the resin layer 12, the barrier layer 13, and the TFT layer 14 provided in a direction in which light is output from the light-emitting element 20 to the outside of the display device 10 is preferably formed of a high transparent material. In the configuration of the display device 10, at least one of the sealing layer 16 and the second film 17 provided on the negative electrode 27 side, which is the opposite side, among the positive electrode 21 and the negative electrode 27 preferably has a reflecting function.

Note that the light-emitting element 20 may be configured to output light from the negative electrode 27 side among the positive electrode 21 and the negative electrode 27 to the outside of the display device 10. In this case, in the configuration of the display device 10, the sealing layer 16 and the second film 17 provided in a direction in which light is output from the light-emitting element 20 to the outside of the display device 10 is preferably formed of a high transparent material. In the configuration of the display device 10, at least one of the first film 11, the resin layer 12, the barrier layer 13, and the TFT layer 14 provided on the positive electrode 21 side which is the opposite side among the positive electrode 21 and the negative electrode 27 preferably has the reflecting function.

Although not illustrated, an electronic circuit board and a power circuit board (for example, an IC chip or FPC) are disposed outside the display region of the display device 10. A plurality of the TFTs and the light-emitting elements 20 described above are arranged on a plane to configure the display region of the display device 10. Power is supplied from each of the above-described circuits to the plurality of TFTs and light-emitting elements 20 arranged on the plane, and each operation is controlled by each of the circuits. Thus, a screen display of the display device 10 is performed.

To make the display device 10 of the present embodiment, first, the resin layer 12 is formed on the support substrate (resin layer 12 forming step). Next, the barrier layer 13 is formed. Next, the TFT layer 14 including the TFTs is formed. Next, the light-emitting element layer 15 including the bottom-emitting type light-emitting elements 20 is formed. Next, the sealing layer 16 is formed. Next, the second film 17 is bonded to the sealing layer 16.

Next, the resin layer 12 is partially removed by irradiating the resin layer 12 with laser light or the like transmitted through the support substrate, and the support substrate is peeled from the resin layer 12 (support substrate peeling step). Next, the first film 11 is bonded to the lower face of the resin layer 12 from which the support substrate has been peeled (bonding step). Next, the layered body including the first film 11, the resin layer 12, the barrier layer 13, the TFT layer 14, the light-emitting element layer 15, the sealing layer 16, and the second film 17 is divided to obtain a plurality of individual pieces. Next, the electronic circuit board is disposed on a portion of a non-display region outside the display region. Note that these steps are performed by a manufacturing apparatus of the display device 10.

In the case where manufacturing the display device 10 having no flexibility, the resin layer 12 forming step, the support substrate peeling step, and the first film 11 bonding step are not necessary, for example, the first film 11 may be replaced with a glass substrate or the like, and steps subsequent to the barrier layer 13 forming step may be performed on the glass substrate. A method corresponding to the material of each layer, such as an application method, sputtering, a photolithography method, or CVD can be appropriately used as a method for layering each layer in the above steps.

Figure 2:
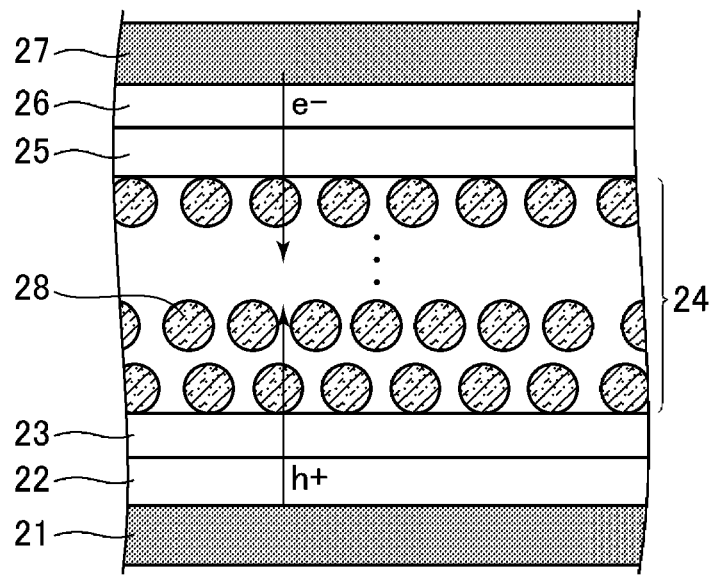
FIG. 2 is a cross-sectional view schematically illustrating a light-emitting element according to a first embodiment.

FIG. 2 is a cross-sectional view schematically illustrating the light-emitting element 20 according to the first embodiment. The light-emitting element 20 of the present embodiment includes the positive electrode 21, a hole injection layer 22, a hole transport layer 23, a quantum dot layer 24, a first electron transport layer 25, a second electron transport layer 26, and the negative electrode 27, and is configured by layering thereof in this order. Note that in the present embodiment, a direction from the light-emitting element 20 to the positive electrode 21 is referred to as a downward direction, and a direction from the positive electrode 21 toward the light-emitting element 20 is referred to as an upward direction. Details of the light-emitting element 20 will be described below.

The positive electrode 21 is an electrode for injecting positive holes into the quantum dot layer 24. The negative electrode 27 is an electrode for injecting electrons into the quantum dot layer 24. The positive electrode 21 and the negative electrode 27 can be formed of a conductive material. The positive electrode 21 is in contact with hole injection layer 22. The negative electrode 27 is in contact with the second electron transport layer 26.

One of the positive electrode 21 and the negative electrode 27 is a light-transmissive electrode and the other is a non-light-transmissive electrode. The light-transmissive electrode can be formed of a conductive material such as ITO, IZO, ZnO, AZO, BZO, or FTO. The non-light-transmissive electrode can be formed of a metal material having high light reflectivity such as Al, Cu, Au, Ag, Mg, or alloys thereof. By using the material having high light reflectivity as the non-light-transmissive electrode, the light emitted by the quantum dot layer 24 can be reflected to a direction in which light is output from the light-emitting element 20.

In the present embodiment, the light emitted by the quantum dot layer 24 is reflected by the negative electrode 27 and transmitted through the positive electrode 21, and is output from the light-emitting element 20 to the outside of the display device 10.

The hole injection layer 22 is a layer for injecting positive holes from the positive electrode 21 into the hole transport layer 23. The hole transport layer 23 is a layer for transporting positive holes injected from the hole injection layer 22 to the quantum dot layer 24. Note that, for example, among the hole injection layer 22 and the hole transport layer 23, only the hole injection layer 22 may be provided between the positive electrode 21 and the quantum dot layer 24, or the hole injection layer 22 and the hole transport layer 23 may be omitted, and the positive electrode 21 and the quantum dot layer 24 may be directly in contact with each other.

The hole injection layer 22 and the hole transport layer 23 can be formed of, for example, an organic material containing a conductive compound such as PEDOT-PSS, TFB, and PVK, or, for example, an inorganic material containing a metal oxide such as NiO, $Cr_2O_3$, MgO, MgZnO, $LaNiO_3$, $MoO_3$, and $WO_3$.

The quantum dot layer 24 is provided between the positive electrode 21 and the negative electrode 27. In the present embodiment, the quantum dot layer 24 is provided between the hole transport layer 23 and the first electron transport layer 25. The quantum dot layer 24 is a layer including quantum dots 28 that are nano-sized semiconductor particles. The quantum dot layer 24 may be a single layer or a multi-layer.

The quantum dots 28 are preferably formed of a material that does not contain cadmium, such as InP, SiC, and SiN. Since the quantum dots 28 do not contain cadmium, the light-emitting element 20 having a small environmental load can be realized. However, in a case where the quantum dots 28 are formed of the material that does not contain cadmium, the electron affinity of the quantum dot layer 24 tends to be reduced as compared with when the quantum dots 28 are formed of a material that contains cadmium.

A particle size of the quantum dots 28 is, for example, about from 2 to 15 nm. The light emission wavelength of the quantum dots 28 changes depending on the particle size. Thus, the light emission wavelength of the light-emitting element 20 can be controlled by changing the particle size of the quantum dots 28. The smaller the particle size of the quantum dots 28, the shorter the light emission wavelength, and the luminescent color changes from red to green and green to blue. Note that when the display device 10 is configured according to the present embodiment, a red light-emitting element 20, a green light-emitting element 20, and a blue light-emitting element 20 are arranged as one set in the light-emitting element layer 15. In order to increase the depth of the luminescent color by the composite light of the light-emitting elements 20 of three colors, the particle size of the quantum dots 28 included in each light-emitting element 20 is preferably made uniform for each color.

For example, the quantum dot layer 24 having quantum dots 28 formed using InP having a particle size that emits green light has an ionization potential of approximately 5.2 eV. The quantum dot layer 24 having quantum dots 28 formed using InP having a particle size that emits red light has an ionization potential of approximately 5.2 eV and an electron affinity of approximately 3.1 eV. The quantum dot layer 24 having quantum dots 28 formed using InP having a particle size that emits blue light has an ionization potential of approximately 5.2 eV and an electron affinity of approximately 2.5 eV.

The first electron transport layer 25 is provided in contact with the quantum dot layer 24 between the quantum dot layer 24 and the negative electrode 27. In the present embodiment, the first electron transport layer 25 is provided between the quantum dot layer 24 and the second electron transport layer 26. In other words, in the first electron transport layer 25, one surface is in contact with the quantum dot layer 24, and the other surface is in contact with the second electron transport layer 26. The first electron transport layer 25 is a layer for transporting electrons from the second electron transport layer 26 to the quantum dot layer 24.

The first electron transport layer 25 contains a compound formed of, for example, Zn, O, and constituent elements M, and the constituent elements M are elements of at least one of Co, Rh, and Ir. In the present embodiment, for example, a compound having a composition of $Zn_A M_B O_C$ (A, B, and C are arbitrary values) is used for the first electron transport layer 25. The constituent elements M contain at least one of Group 9 elements Co, Rh and Ir.

The compound $Zn_A M_B O_C$ used in the first electron transport layer 25 may contain a plurality of compounds, in which the constituent elements M differ from each other.

The compounds different from each other that contain the constituent elements M may be, for example, $Zn_A(Co_{B1} \cdot Rh_{B2})O_C$, $Zn_A(Co_{B1} \cdot Ir_{B3})O_C$, $Zn_A(Rh_{B2} \cdot Ir_{B3})O_C$, and $Zn_A(Co_{B1} \cdot Rh_{B2} \cdot Ir_{B3})O_C$, (B1, B2, and B3 are arbitrary values).

The compound $Zn_A M_B O_C$ used in the first electron transport layer 25 can be, for example, A=1, B=2, C=4, in other words compound $ZnM_2O_4$.

Accordingly, the content percentage of elements contained in the constituent elements M can be selected such that the electron affinity of the first electron transport layer 25 is within a predetermined range close to the electron affinity of the quantum dot layer 24. Thus, the electron affinity of the first electron transport layer 25 and the electron affinity of the quantum dot layer 24 can be brought closer to each other to reduce the injection barrier to electrons in a direction from the first electron transport layer 25 toward the quantum dot layer 24. As a result, electrons transported from the first electron transport layer 25 to the quantum dot layer 24 increase, and the luminous efficiency of the light-emitting element 20 can be increased. Note that $ZnM_2O_4$ may have a spinel crystal structure.

For example, even if the electron affinity of the quantum dot layer 24 is reduced by forming the quantum dots 28 with a material that does not contain cadmium, the electron affinity of the first electron transport layer 25 can be brought closer to the electron affinity of the quantum dot layer 24 within a predetermined range by using the compound $ZnM_2O_4$ as the material of the first electron transport layer 25. As a result, the quantum dot layer 24 can be configured to be cadmium free (formed of a material that does not contain cadmium), and a reduction in the luminous efficiency of the light-emitting element 20 can be prevented. Details will be described below using examples.

The electron affinity of the quantum dot layer 24 is preferably equal to the electron affinity of the first electron transport layer 25 or greater. Alternatively, in the constituent elements M of the first electron transport layer 25, the kinds of elements included in the constituent elements M and ratio thereof may be appropriately selected such that the electron affinity of the first electron transport layer 25 is greater than the electron affinity of the quantum dot layer 24 and the electron affinity of the first electron transport layer 25 is within the predetermined range close to the electron affinity of the quantum dot layer 24.

Here, the "predetermined range" in which the electron affinity of the first electron transport layer 25 is close to the electron affinity of the quantum dot layer 24 is preferably, for example, 0.5 eV or less which is a value obtained by subtracting the electron affinity of the quantum dot layer 24 from the electron affinity of the first electron transport layer 25. In the first electron transport layer 25, since the electron density with respect to energy follows the Boltzmann distribution, electrons are present in a shape with a long tail on the high energy side, and electrons contributing to electrical conduction are present at an unignorable density in a case of 0.5 eV or less. This sufficiently reduces the injection barrier to electrons in the direction from the first electron transport layer 25 toward the quantum dot layer 24. As a result, electrons transported from the first electron transport layer 25 to the quantum dot layer 24 increases more reliably, and the luminous efficiency of the light-emitting element 20 can be increased.

The second electron transport layer 26 is provided between the first electron transport layer 25 and the negative electrode 27. The second electron transport layer 26 is in contact with each of the first electron transport layer 25 and the negative electrode 27. The second electron transport layer 26 is formed of a material whose electron affinity and ionization potential are smaller than the electron affinity of the first electron transport layer 25 and smaller than the work function of the negative electrode 27. As a result, the junction between the second electron transport layer 26 and the negative electrode 27 becomes a tunnel junction, and electrons are easily injected from the negative electrode 27 into the second electron transport layer 26. Note that, in a case where a combination of materials is such that the barrier between the first electron transport layer 25 and the negative electrode 27 is sufficiently small, the second electron transport layer 26 may be omitted.

Figures 3, 4:
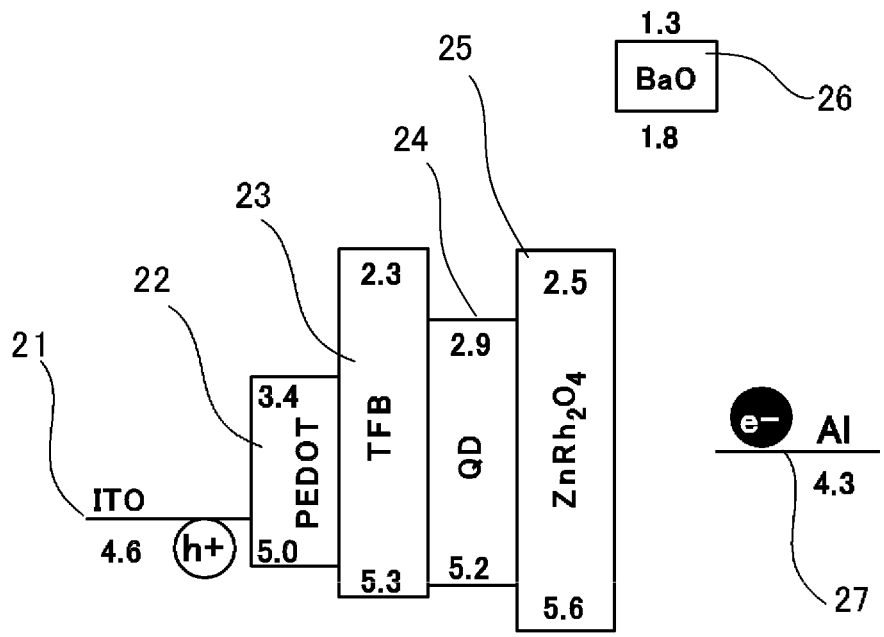
FIG. 3 is a table exemplifying materials used in a second electron transport layer of the light-emitting element according to the first embodiment.
FIG. 4 is an energy diagram illustrating an example of electron affinity and ionization potential of each layer between a positive electrode and a negative electrode of a light-emitting element according to an example 1-1.

FIG. 3 is a table exemplifying materials for forming the second electron transport layer 26. For example, the second electron transport layer 26 can be formed using any of the materials exemplified in FIG. 3. The materials exemplified in FIG. 3 are high-resistance semiconductors having an electron mobility of approximately from 1 to 10 $cm^2/V \cdot sec$. Although the materials for forming the second electron transport layer 26 are exemplified in FIG. 3, materials having a relationship of the characteristic values with the first electron transport layer 25 and the negative electrode 27 satisfying the above-described condition may be employed as the material for forming the second electron transport layer 26. In particular, a material whose electrical junction between the second electron transport layer 26 and the negative electrode 27 is a Schottky junction is preferably employed as the material for forming the second electron transport layer 26. As exemplified in FIG. 3, for example, BaO (electron affinity: 1.25 (eV), ionization potential: 1.8 (eV)), SrO (electron affinity: 1.43 (eV), ionization potential: 6.5 (eV)), CaO (electron affinity: 1.78 (eV), ionization potential: 8.8 (eV)), $LaB_6$ (electron affinity: 2.69 (eV), ionization potential: 1.4 (eV)), TiC (electron affinity: 3.32 (eV), ionization potential: 4.5 (eV)), ZrC (electron affinity: 3.38 (eV), ionization potential: 5.4 (eV)), HfC (electron affinity: 3.40 (eV), ionization potential: 6.6 (eV)), NdC (electron affinity: 3.45 (eV), ionization potential: 6.8 (eV)), TaC (electron affinity: 3.61 (eV), ionization potential: 7.2 (eV)), and the like are included as a material for forming the second electron transport layer 26. Furthermore, in addition to the materials exemplified in FIG. 3, for example, $GdB_4$, $CeC_2$, $YB_4$, $CeB_6$, $ThO_2$, and the like can also be used as the material for forming the second electron transport layer 26.

The material of the second electron transport layer 26 is preferably a degenerate semiconductor. For example, the material of the second electron transport layer 26 is preferably BaO. BaO has a narrow band gap of 0.5 eV. BaO is a degenerate semiconductor whose Fermi level is higher than the bottom of the conduction band. Thus, in a case where the negative electrode 27 is formed using, for example, Al, the electrical junction between the second electron transport layer 26 and the negative electrode 27 becomes a Schottky junction, and a depletion layer is generated at the junction. Thus, in the direction from the negative electrode 27 toward the second electron transport layer 26, a barrier to electrons having a very narrow width is generated by the depletion layer, and the tunneling effect increases. As a result, the tunneling current increases to further reduce the contact resistance, and the injection efficiency of electrons can be further improved. As a result, extremely excellent ohmic characteristics can be realized between the negative electrode 27 and the second electron transport layer 26.

Note that in a case where the light-emitting element 20 output light from the negative electrode 27 side to the outside, the first electron transport layer 25, the second electron transport layer 26, and the negative electrode 27 are formed of transparent materials. For example, the three layers are preferably formed of materials having the light transmittance of 95% or greater. As a result, attenuation of light emitted from the quantum dot layer 24 to the outside due to the first electron transport layer 25, the second electron transport layer 26, and the negative electrode 27 can be suppressed.

According to the above-described configuration of the light-emitting element 20, when a potential difference is applied between the positive electrode 21 and the negative electrode 27, positive holes are injected from the positive electrode 21 and electrons are injected from the negative electrode 27, toward the quantum dot layer 24.

In other words, as indicated by arrow $h^+$ in FIG. 2, positive holes from the positive electrode 21 reach the quantum dot layer 24 via the hole injection layer 22 and the hole transport layer 23. Further, as indicated by an arrow $e^-$ in FIG. 2, electrons from the negative electrode 27 reach the quantum dot layer 24 via the second electron transport layer 26 and the first electron transport layer 25. Then, positive holes and electrons that have reached the quantum dot layer 24 recombine with each other at the quantum dots 28, and light is output from the quantum dot layer 24.

As described above, the light-emitting element 20 emits light. The height of the barrier to positive holes is the difference between the ionization potential or the work function of a layer from which positive holes flow and the ionization potential of a layer into which positive holes flow. The height of the barrier to electrons is the difference between the electron affinity or the work function of a layer from which electrons flow and the electron affinity of a layer into which electrons flow. The smaller the respective barriers, the more easily positive holes and electrons are injected into the quantum dot layer 24.

In the light-emitting element 20 in the present embodiment, for example, the output light of the quantum dot layer 24 reflected by the negative electrode 27 of the metal electrode is transmitted through the light-transmissive positive electrode 21 and is emitted to the outside of the light-emitting element 20. Alternatively, the positive electrode 21 may be a metal electrode and the negative electrode 27 may be a light-transmissive electrode, and light may be emitted from the negative electrode side to the outside. Alternatively, the order of layering may be reversed, and the negative electrode, the second electron transport layer, the first electron transport layer, the quantum dot layer, the hole transport layer, the hole injection layer, and the positive electrode may be in this order from the bottom.

Here, the electron affinity of the quantum dot layer 24 is preferably equal to the electron affinity of the first electron transport layer 25 or greater. Accordingly, the injection barrier to electrons is eliminated in the direction from the first electron transport layer 25 toward the quantum dot layer 24. As a result, the luminous efficiency of the light-emitting element 20 can be further improved.

The ionization potential of the quantum dot layer 24 is preferably equal to the ionization potential of the first electron transport layer 25 or less. According to this configuration, the barrier to positive holes increases in the direction from the quantum dot layer 24 toward the first electron transport layer 25. Accordingly, the flow of positive holes from the quantum dot layer 24 to the negative electrode 27 via the first electron transport layer 25 can be suppressed. As a result, the number of positive holes remaining in the quantum dot layer 24 increases, and the recombination rate of positive holes and electrons in the quantum dot layer 24 is improved. As a result, the luminous efficiency of the light-emitting element 20 can be further improved.

The light-emitting element 20 according to the present embodiment will be specifically described below based on examples 1-1 to 1-11 and a comparative example.

Example 1-1

As the examples 1-1 to 1-11, light-emitting elements 20 in which the compound $ZnM_2O_4$ as the composition of the first electron transport layer 25 was variously changed were prepared and compared with a light-emitting element according to the comparative example. Description will be sequentially made from the example 1-1.

FIG. 4 is an energy diagram illustrating an example of the electron affinity and the ionization potential of each layer between the positive electrode 21 and the negative electrode 27 of the light-emitting element 20 according to the example 1-1. Note that in FIG. 4, each of the work functions (in eV) of the positive electrode 21 and the negative electrode 27 is expressed by a numerical value.

FIG. 5 is a table showing compositions and characteristic values of light-emitting elements according to each of examples and a comparative example. In FIG. 5, the proportions (in %) of Group 9 elements contained in the constituent elements M are exemplified for each example.

As illustrated in FIG. 4 and FIG. 5, in the example 1-1, the light-emitting element 20 (FIG. 2) in which the first electron transport layer 25 was formed of $ZnRh_2O_4$ was prepared. In other words, the example 1-1 is an example in which the composition of the first electron transport layer 25 is such that the constituent elements M of the compound $ZnM_2O_4$ is Rh.

In FIG. 4, a case is illustrated in which from the left side to the right side the positive electrode 21 is formed of ITO, the hole injection layer 22 is formed of PEDOT, the hole transport layer 23 is formed of TFB, the quantum dots 28 included in the quantum dot layer 24 are formed of InP having a particle size that emits green color, the first electron transport layer 25 is formed of $ZnRh_2O_4$, the second electron transport layer 26 is formed of BaO, and the negative electrode 27 is formed of Al. In this case, the hole injection layer 22 had the ionization potential of 5.0 eV and the electron affinity of 3.4 eV. The hole transport layer 23 had the ionization potential of 5.3 eV and the electron affinity of 2.3 eV. The quantum dot layer 24 had the ionization potential of 5.6 eV and the electron affinity of 2.9 eV. The first electron transport layer 25 had the ionization potential of 5.6 eV and the electron affinity of 2.5 eV. The second electron transport layer 26 had the ionization potential of 1.8 eV and the electron affinity of 1.3 eV. The positive electrode 21 had the work function of 4.6 eV and the negative electrode 27 had the work function of 4.3 eV.

Here, a state in which positive holes and electrons are transported in each layer of the light-emitting element 20 will be described with reference to FIG. 2 and FIG. 4. In the light-emitting element 20, when a potential difference is generated between the positive electrode 21 and the negative electrode 27, positive holes are injected into the hole injection layer 22 from the positive electrode 21, as indicated by the arrow h$^+$ in FIG. 2. Positive holes are then injected from the hole injection layer 22 into the hole transport layer 23, and positive holes are transported from the hole transport layer 23 to the quantum dot layer 24.

The height of the barrier to positive holes is the difference between the ionization potential or the work function of a layer from which positive holes flow and the ionization potential of a layer into which positive holes flow.

In other words, as illustrated in FIG. 4, the barrier when positive holes are transported from the positive electrode 21 to the hole injection layer 22 is 0.4 eV expressed by the difference obtained by subtracting the work function of the positive electrode 21 from the ionization potential of the hole injection layer 22. The barrier when positive holes are transported from the hole injection layer 22 into the hole transport layer 23 is 0.3 eV expressed by the difference obtained by subtracting the ionization potential of the hole transport layer 23 from the ionization potential of the hole injection layer 22. The barrier when the positive holes are transported from the hole transport layer 23 to the quantum dot layer 24 is −0.1 eV expressed by the difference obtained by subtracting the ionization potential of the quantum dot layer 24 from the ionization potential of the hole transport layer 23. The barrier when positive holes are transported from the quantum dot layer 24 to the first electron transport layer 25 is 0.4 eV expressed by the difference obtained by subtracting the ionization potential of the first electron transport layer 25 from the ionization potential of the quantum dot layer 24.

On the other hand, as indicated by the arrow e$^−$ in FIG. 2, electrons are injected from the negative electrode 27 into the second electron transport layer 26. Electrons are then injected from the second electron transport layer 26 into the first electron transport layer 25, and electrons are transported from the first electron transport layer 25 to the quantum dot layer 24.

The height of the barrier to electrons is the difference between the electron affinity or the work function of a layer from which electrons flow and the electron affinity of a layer into which electrons flow.

In other words, as illustrated in FIG. 4, the barrier when electrons are transported from the negative electrode 27 to the second electron transport layer 26 is 3.0 eV expressed by the difference obtained by subtracting the electron affinity of the second electron transport layer 26 from the work function of the negative electrode 27. The barrier when electrons are transported from the second electron transport layer 26 to the first electron transport layer 25 is −1.2 eV, which is a difference obtained by subtracting the electron affinity of the first electron transport layer 25 from the electron affinity of the second electron transport layer 26. The barrier when electrons are transported from the first electron transport layer 25 to the quantum dot layer 24 is −0.4 eV expressed by a difference obtained by subtracting the electron affinity of the quantum dot layer 24 from the electron affinity of the first electron transport layer 25.

As described above, in the example 1-1, since the first electron transport layer 25 was formed of $ZnRh_2O_4$, the barrier when electrons are transported from the first electron transport layer 25 to the quantum dot layer 24 could be −0.4 eV, which is the predetermined range. Note that, as will be described in detail below, the negative electrode 27 and the second electron transport layer 26 form the tunnel junction, and electrons are easily injected into the second electron transport layer 26 from the negative electrode 27.

Figure 8:
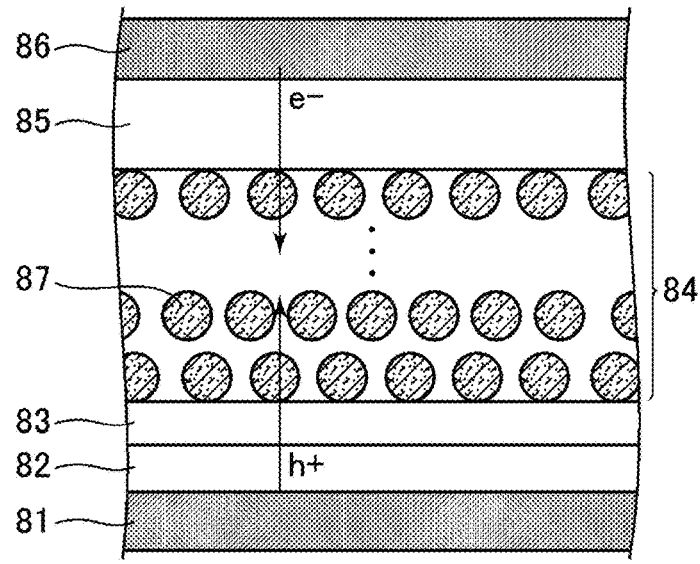
FIG. 8 is a cross-sectional view schematically illustrating a light-emitting element according to a comparative example.
Figure 9:
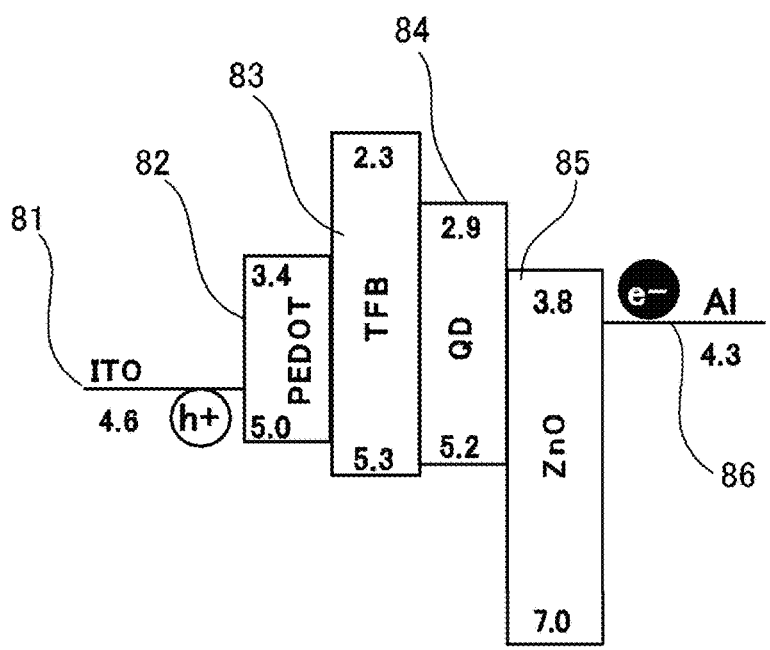
FIG. 9 is an energy diagram illustrating an example of electron affinity and ionization potential of each layer between a positive electrode and a negative electrode according to the light-emitting element of the comparative example.

Here, a comparative example that is a comparison target of the example 1-1 will be described. FIG. 8 is a cross-sectional view schematically illustrating a light-emitting element 80 according to the comparative example. FIG. 9 is an energy diagram illustrating an example of the electron affinity and the ionization potential of each layer between a positive electrode 81 and a negative electrode 86 of the light-emitting element 80 according to the comparative example. Note that in FIG. 9, each of the work functions (in eV) of the positive electrode 81 and the negative electrode 86 is expressed by a numerical value.

As illustrated in FIG. 8, the light-emitting element 80 according to the comparative example has a configuration in which the first electron transport layer 25 and the second electron transport layer 26 of the light-emitting element 20 illustrated in FIG. 2 are changed to an electron transport layer 85 of a single layer. In other words, the light-emitting element 80 is configured to include the positive electrode 81, a hole injection layer 82, a hole transport layer 83, a quantum dot layer 84 including quantum dots 87, the electron transport layer 85, and the negative electrode 86, which are layered in this order.

As illustrated in FIG. 9 and FIG. 5, the light-emitting element 80 according to the comparative example was prepared, in which the electron transport layer 85 was formed using ZnO, and other layers were formed of the same materials as the light-emitting element 20 according to the example 1-1. In other words, the light-emitting element 80 illustrates a case in which from the left side to the right side in FIG. 9, the positive electrode 81 is formed of ITO, the hole injection layer 82 is formed of PEDOT, the hole transport layer 83 is formed of TFB, the quantum dots 87 included in the quantum dot layer 84 are formed of InP having a particle size that emits green color, the electron transport layer 85 is formed of ZnO, and the negative electrode 86 is formed of Al.

In the comparative example, the electron transport layer 85 formed using ZnO had the ionization potential of 7.0 eV and the electron affinity of 3.8 eV. Thus, the barrier when electrons are transported from the electron transport layer 85 to the quantum dot layer 84 is 0.9 eV expressed by a difference obtained by subtracting the electron affinity of the quantum dot layer 84 from the electron affinity of the electron transport layer 85, and the difference is large.

Here, since cadmium has a large environmental load, the quantum dots 87 may be formed of, for example, a material that does not contain cadmium. However, in a case where the quantum dots 87 are formed of the material that does not contain cadmium, the electron affinity of the quantum dot layer 84 tends to be reduced as compared with when the quantum dots 87 are formed of a material that contains cadmium. Thus, in particular, in a case where the quantum dots 87 are formed of the material that does not contain cadmium, the difference between the electron affinity of the quantum dot layer 84 and the electron affinity of the electron transport layer 85 formed using ZnO becomes 0.9 eV, as described above, which is relatively large. As a result, injection of electrons from the electron transport layer 85 into the quantum dots 87 is inhibited, and the luminous efficiency of the light-emitting element 80 is reduced.

On the other hand, as described above, as illustrated in FIG. 4, according to the light-emitting element 20 according to the example 1-1, since the first electron transport layer 25 was formed of $ZnRh_2O_4$, the barrier when electrons are transported from the first electron transport layer 25 to the quantum dot layer 24 could be −0.4 eV, which is smaller than 0.9 eV according to the comparative example. In other words, the electron affinity of the first electron transport layer 25 and the electron affinity of the quantum dot layer 24 could be brought closer to each other to reduce the injection barrier to electrons in a direction from the first electron transport layer 25 toward the quantum dot layer 24. As a result, according to the light-emitting element 20 according to the example 1-1, as compared with the light-emitting element 80 according to the comparative example, electrons transported from the first electron transport layer 25 to the quantum dot layer 24 increased, and the luminous efficiency of the light-emitting element 20 could be increased.

In other words, in the light-emitting element 20 according to the example 1-1, although the electron affinity of the quantum dot layer 24 was reduced by forming the quantum dots 28 with the material that does not contain cadmium, the electron affinity of the first electron transport layer 25 could be brought closer to the electron affinity of the quantum dot layer 24 by forming the first electron transport layer 25 using $ZnM_2O_4$. As a result, the quantum dot layer 24 could be configured to be cadmium free, and the reduction in the luminous efficiency of the light-emitting element 20 could be prevented.

Note that in the present example, setting the barrier when electrons are transported from the first electron transport layer 25 to the quantum dot layer 24 to be within the "predetermined range" can also be expressed as setting an absolute value to be smaller than 0.9 eV, which is the barrier when electrons are transported from the electron transport layer 85 to the quantum dot layer 84 in the comparative example.

Then, the luminance and luminous efficiency were measured when each of the light-emitting element 20 according to the example 1-1 and the light-emitting element 80 according to the comparative example was emitted. The light-emitting element 80 according to the comparative example had the luminance of 20000 $cd/m^2$ and the luminous efficiency of 8%. In contrast, the light-emitting element 20 according to the example 1-1 had the luminance of 45000 $cd/m^2$ and the luminous efficiency of 15%. As described above, the light-emitting element 20 according to the example 1-1 had higher luminance and luminous efficiency than that of the light-emitting element 80 according to the comparative example.

As described above, in the example 1-1, BaO was used for the second electron transport layer 26. As exemplified in FIG. 3, the electron affinity of the second electron transport layer 26 using BaO is 1.3 eV, and the ionization potential is 1.8 eV. As described above, the work function of the negative electrode 27 is 4.3 eV, and the electron affinity of the first electron transport layer 25 is 2.5 eV. Thus, both the electron affinity and the ionization potential of the second electron transport layer 26 are smaller than the electron affinity of the first electron transport layer 25 and smaller than the work function of the negative electrode 27. As a result, the junction between the second electron transport layer 26 and the negative electrode 27 became a Schottky junction, and a tunneling phenomenon occurred. Thus, in the light-emitting element 20 of the example 1-1, the junction between the second electron transport layer 26 and the negative electrode 27 became the tunnel junction. As a result, the contact resistance between the negative electrode 27 and the second electron transport layer 26 was reduced, and good ohmic characteristics could be realized. Thus, electrons were easily injected from the negative electrode 27 into the second electron transport layer 26.

Since the electron affinity of the second electron transport layer 26 is smaller than the electron affinity of the first electron transport layer 25, there exists no barrier to electrons when electrons are transported from the second electron transport layer 26 to the first electron transport layer 25. Thus, electrons injected into the second electron transport layer 26 can be easily transported to the first electron transport layer 25. As a result, the amount of electrons in the quantum dot layer 24 increased, and the luminous efficiency of the light-emitting element 20 could be further improved.

For example, in the light-emitting element in which the second electron transport layer 26 is omitted from that of the example 1-1, and the first electron transport layer 25 and the negative electrode 27 are directly connected to each other, since the electron affinity of the first electron transport layer 25 is 2.50 eV and the ionization potential is 5.6 eV, whereas the work function of the negative electrode 27 is 4.3 eV, a barrier having a height of 1.8 eV is generated to electrons when electrons are transported from the negative electrode 27 to the first electron transport layer 25. In the comparative example, the electron affinity of the electron transport layer 85 is 3.8 eV and in a case where the negative electrode 27 is Al, the barrier height to electrons is 0.5 eV. Thus, unlike the light-emitting element 20 according to the comparative example, in a case where the second electron transport layer 26 is not provided, the contact resistance between the negative electrode 27 and the first electron transport layer 25 may be greater than that of the comparative example depending on the combination of the materials of the respective layers. In addition, since the ionization potential of the first electron transport layer 25 is greater than the work function of the negative electrode 27, the tunneling phenomenon does not occur. As a result, the injection efficiency of electrons into the quantum dot layer 24 is reduced, and the luminous efficiency deteriorates.

On the other hand, in the example 1-1, as described above, the second electron transport layer 26 was provided between the first electron transport layer 25 and the negative electrode 27. The ionization potential of the second electron transport layer 26 is smaller than the work function of negative electrode 27, and the electron affinity of the second electron transport layer 26 is much smaller than the work function of negative electrode 27. Thus, in the direction from the negative electrode 27 toward the first electron transport layer 25, the barrier to electrons was very high, and the width of the depletion layer generated at the junction portion was narrowed. As a result, the tunneling effect occurred owing to the narrowing of the barrier, and electrons injected from the negative electrode 27 penetrated the barrier and flowed into the second electron transport layer 26 side. As a result, the tunneling current increased and electrons were easily injected from the negative electrode 27 into the second electron transport layer 26.

Since the electron affinity of the second electron transport layer 26 was smaller than the electron affinity of the first electron transport layer 25, the barrier to electrons could be substantially zero in the direction from the second electron transport layer 26 toward the first electron transport layer 25. Thus, electrons flowing into the second electron transport layer 26 from the negative electrode 27 could be efficiently injected into the first electron transport layer 25 side. As a result, the voltage required to transport electrons decreases, and the power consumption of the light-emitting element 20 decreased, and heat generation of the light-emitting element 20 could also be suppressed. Moreover, the rising voltage could be reduced as compared with the comparative example.

Example 1-2

As shown in FIG. 5, in the example 1-2, unlike the example 1-1, the light-emitting element 20 in which the first electron transport layer 25 was formed of $ZnIr_2O_4$ was prepared. In other words, the example 1-2 is an example in which the composition of the first electron transport layer 25 is such that the constituent elements M of the compound $ZnM_2O_4$ is Ir. Other configuration and materials of the light-emitting element 20 according to the example 1-2 are the same as those of the light-emitting element 20 according to the example 1-1.

In the light-emitting element 20 of the example 1-2, the first electron transport layer 25 had the ionization potential of 5.1 eV and the electron affinity of 2.6 eV. Thus, in the light-emitting element 20 of the example 1-2, the barrier when electrons are transported from the first electron transport layer 25 to the quantum dot layer 24 is −0.3 eV expressed by a difference obtained by subtracting the electron affinity of the quantum dot layer 24 from the electron affinity of the first electron transport layer 25. Thus, even with the light-emitting element 20 of the example 1-2, the barrier (−0.3 eV) when electrons are transported from the first electron transport layer 25 to the quantum dot layer 24 could be made smaller than the barrier (0.9 eV) when electrons are transported from the electron transport layer 85 to the quantum dot layer 84 in the light-emitting element 80 according to the comparative example. In other words, the electron affinity of the first electron transport layer 25 and the electron affinity of the quantum dot layer 24 could be brought closer to each other to reduce the injection barrier to electrons in a direction from the first electron transport layer 25 toward the quantum dot layer 24. As a result, even with the light-emitting element 20 according to the example 1-2, as compared with the light-emitting element 80 according to the comparative example, electrons transported from the first electron transport layer 25 to the quantum dot layer 24 increased and the luminous efficiency of the light-emitting element 20 could also be increased.

The luminance and the luminous efficiency were measured when the light-emitting element 20 according to the example 1-2 was caused to emit light, and the luminance was 43000 $cd/m^2$, and the luminous efficiency was 13%. As described above, the light-emitting element 20 according to the example 1-2 had the luminance and the luminous efficiency higher than the luminance (20000 $cd/m^2$) and the luminous efficiency (8%) of the light-emitting element 80 according to the comparative example.

The light-emitting element 20 of the example 1-2 was also provided with the second electron transport layer 26 between the first electron transport layer 25 and the negative electrode 27. As a result, similar to the example 1-1, in the direction from the negative electrode 27 toward the first electron transport layer 25, the barrier to electrons was significantly reduced owing to the tunnel junction. Thus, according to the first electron transport layer 25 of the example 1-2, the light-emitting element 20 having a higher luminance than that of the comparative example and higher luminous efficiency than that of the comparative example could be realized.

Example 1-3

As shown in FIG. 5, in the example 1-3, unlike the example 1-1, the light-emitting element 20 in which the first electron transport layer 25 was formed of $ZnCo_2O_4$ was prepared. In other words, the example 1-3 is an example in which the composition of the first electron transport layer 25 is such that the constituent elements M of the compound $ZnM_2O_4$ is Co. Other configuration and materials of the light-emitting element 20 according to the example 1-3 are the same as those of the light-emitting element 20 according to the example 1-1.

In the light-emitting element 20 of the example 1-3, the first electron transport layer 25 had the ionization potential of 6.6 eV and the electron affinity of 2.4 eV. Thus, in the light-emitting element 20 of the example 1-3, the barrier when electrons are transported from the first electron transport layer 25 to the quantum dot layer 24 is −0.5 eV expressed by a difference obtained by subtracting the electron affinity of the quantum dot layer 24 from the electron affinity of the first electron transport layer 25. Thus, even with the light-emitting element 20 of the example 1-3, the barrier (−0.5 eV) when electrons are transported from the first electron transport layer 25 to the quantum dot layer 24 could be made smaller than the barrier (0.9 eV) when electrons were transported from the electron transport layer 85 to the quantum dot layer 84 in the light-emitting element 80 according to the comparative example. In other words, the electron affinity of the first electron transport layer 25 and the electron affinity of the quantum dot layer 24 could be brought closer to each other to reduce the injection barrier to electrons in a direction from the first electron transport layer 25 toward the quantum dot layer 24. As a result, even with the light-emitting element 20 according to the example 1-3, as compared with the light-emitting element 80 according to the comparative example, electrons transported from the first electron transport layer 25 to the quantum dot layer 24 increased and the luminous efficiency of the light-emitting element 20 could also be increased.

The luminance and the luminous efficiency were measured when the light-emitting element 20 according to the example 1-3 was emitted, and the luminance was 50000 cd/m$^2$, and the luminous efficiency was 18%. As described above, the light-emitting element 20 according to the example 1-3 had the luminance and the luminous efficiency higher than the luminance (20000 cd/m$^2$) and the luminous efficiency (8%) of the light-emitting element 80 according to the comparative example.

The light-emitting element 20 of the example 1-3 was also provided with the second electron transport layer 26 between the first electron transport layer 25 and the negative electrode 27. As a result, similar to the example 1-1, in the direction from the negative electrode 27 toward the first electron transport layer 25, the barrier to electrons was significantly reduced owing to the tunnel junction. Thus, according to the first electron transport layer 25 of the example 1-3, the light-emitting element 20 having a higher luminance than that of the comparative example and higher luminous efficiency than that of the comparative example could be realized.

Examples 1-4 to 1-11

As shown in FIG. 5, in each of the examples 1-4 to 1-11, unlike the examples 1-1 to 1-3, the light-emitting element 20 in which the constituent elements M of $ZnM_2O_4$ included in the first electron transport layer 25 includes two or more elements of Co, Rh, and Ir was prepared. The example 1-4 is an example in which the composition of the first electron transport layer 25 is such that the constituent elements M of the compound $ZnM_2O_4$ is Ir and Rh (Ir:Rh=50:50). The example 1-5 is an example in which the composition of the first electron transport layer 25 is such that the constituent elements M of the compound $ZnM_2O_4$ is Ir and Co (Ir:Co=50:50). The example 1-6 is an example in which the composition of the first electron transport layer 25 is such that the constituent elements M of the compound $ZnM_2O_4$ is Rh and Co (Rh:Co=50:50). The example 1-7 is an example in which the composition of the first electron transport layer 25 is such that the constituent elements M of the compound $ZnM_2O_4$ is Ir, Rh and Co (Ir:Rh:Co=35:30:35). The example 1-8 is an example in which the composition of the first electron transport layer 25 is such that the constituent elements M of the compound $ZnM_2O_4$ is Ir and Rh (Ir:Rh=50:50). The example 1-9 is an example in which the composition of the first electron transport layer 25 is such that the constituent elements M of the compound $ZnM_2O_4$ is Ir and Co (Ir:Co=50:50). The example 1-10 is an example in which the composition of the first electron transport layer 25 is such that the constituent elements M of the compound $ZnM_2O_4$ is Rh and Co (Rh:Co=50:50). The example 1-11 is an example in which the composition of the first electron transport layer 25 is such that the constituent elements M of the compound $ZnM_2O_4$ is Ir, Rh and Co (Ir:Rh:Co=35:30:35). Other configuration and materials of the light-emitting element 20 in each of the examples 1-4 to 1-11 are the same as those of the light-emitting element 20 according to the example 1-1.

In the examples 1-4 to 1-7, the first electron transport layers 25 formed of a mixture was formed. In the examples 1-8 to 1-11, the first electron transport layers 25 formed of a solid solution was formed. The first electron transport layer 25 formed of the mixture in the examples 1-4 to 1-7 is formed by a three-source sputtering method using $ZnIr_2O_4$, $ZnRh_2O_4$ and $ZnCo_2O_4$ as separate targets. The content percentage of each element in the constituent elements M is controlled by a ratio of plasma power when the sputtering is performed. For example, in the example 1-7, in order to form a compound in which the constituent elements M contain Ir in a ratio of 35%, Rh in a ratio of 30%, and Co in a ratio of 35%, three targets $ZnIr_2O_4$, $ZnRh_2O_4$, and $ZnCo_2O_4$ were prepared, and the plasma power applied to each target was set to a ratio of 35:30:35 when the sputtering was performed. Note that the first electron transport layer 25 in which the constituent elements M contain Ir in a ratio of 35%, Rh in a ratio of 30%, and Co in a ratio of 35% may be formed by sputtering using a compound containing each element mixed in the above-described ratio as one target.

The first electron transport layers 25 formed of the solid solutions of the examples 1-8 to 1-11 use Zn or ZnO as well as Ir, Rh, and Co as separate targets. Oxygen gas in addition to Ar gas is fed into the sputtering apparatus to form a $ZnM_2O_4$ film by reactive sputtering. In this case, the content percentage of each element was controlled by the ratio of the plasma power applied to each target.

As in the examples 1-4 to 1-7 and the examples 1-8 to 1-11, even when the ratio of the elements included in the constituent elements M is the same, the electron affinity and the ionization potential change depending on whether the first electron transport layer 25 is the mixture or the solid solution. In general, the electronic properties differ between the simple mixture and the solid solution. The mixture is a mixture of a plurality of substances, and when each substance is uniformly mixed, for example, in the form of fine particles on the order of the nanoscale or less, the electron affinity and the ionization potential are average values of the mixed substances. On the other hand, the solid solution is in a state in which atoms are bonded to each other, and since a state of valence electron changes due to the bonding, the electron affinity and the ionization potential are not the average value of the solutionized substances and change non-linearly with respect to the composition.

Specifically, in the light-emitting element 20 of the example 1-4, the first electron transport layer 25 had the ionization potential of 5.2 eV and the electron affinity of 2.55 eV. In the light-emitting element 20 of the example 1-5, the first electron transport layer 25 had the ionization potential of 6.5 eV and the electron affinity of 2.50 eV. In the light-emitting element 20 of the example 1-6, the first electron transport layer 25 had the ionization potential of 6.6 eV and the electron affinity of 2.45 eV. In the light-emitting element 20 of the example 1-7, the first electron transport layer 25 had the ionization potential of 5.3 eV and the electron affinity of 2.52 eV. In the light-emitting element 20 of the example 1-8, the first electron transport layer 25 had the ionization potential of 5.3 eV and the electron affinity of 2.45 eV. In the light-emitting element 20 of the example 1-9, the first electron transport layer 25 had the ionization potential of 5.8 eV and the electron affinity of 2.30 eV. In the light-emitting element 20 of the example 1-10, the first electron transport layer 25 had the ionization potential of 6.0 eV and the electron affinity of 2.26 eV. In the light-emitting element 20 of the example 1-11, the first electron transport layer 25 had the ionization potential of 6.2 eV and the electron affinity of 2.32 eV.

In the light-emitting element 20 of each of the examples 1-4 to 1-11, the barrier when electrons are transported from the first electron transport layer 25 to the quantum dot layer 24 is expressed by a difference obtained by subtracting the electron affinity of the quantum dot layer 24 from the electron affinity of the first electron transport layer 25, and is −0.35 eV in the example 1-4, −0.40 eV in the example 1-5, −0.45 eV in the example 1-6, −0.38 eV in the example 1-7, −0.45 eV in the example 1-8, −0.60 eV in the example 1-9, −0.64 eV in the example 1-10, and −0.58 eV in the example 1-11. In each of the light-emitting elements 20 according to the examples 1-4 to 1-11, the barrier when electrons are transported from the first electron transport layer 25 to the quantum dot layer 24 could be made smaller than the barrier (0.9 eV) when electrons are transported from the electron transport layer 85 to the quantum dot layer 84 in the light-emitting element 80 according to the comparative example. As a result, according to each of the light-emitting elements 20 according to the examples 1-4 to 1-11, as compared with the light-emitting element 80 according to the comparative example, electrons transported from the first electron transport layer 25 to the quantum dot layer 24 increased and the luminous efficiency of the light-emitting element 20 could be increased.

As in the examples 1-4 to 1-11, by using two or more elements as the constituent elements M of the first electron transport layer 25 and adjusting the composition of the two or more elements, the electron affinity and the ionization potential of the first electron transport layer 25 could be more finely adjusted. As a result, the electron affinity and the ionization potential of the first electron transport layer 25 could be readily altered depending on the electron affinity and the ionization potential of each of the adjacent quantum dot layer 24 and second electron transport layer 26.

Examples 1-1 to 1-11

For example, in a quantum dot layer using quantum dots 28 of InP emitting green light, the ionization potential is approximately 5.2 eV. In contrast, in the examples 1-1 to 1-11 shown in FIG. 5, the range of the ionization potential of the first electron transport layer 25 based on $ZnM_2O_4$ is from 5.1 to 6.6 eV. Thus, among the first electron transport layers 25 of these examples, a layer having an ionization potential greater than that of the adjacent quantum dot layer 24 may be selected. As a result, the barrier to the positive holes in a direction from the quantum dot layer 24 toward the first electron transport layer 25 increases, and the positive holes can be prevented from flowing out of the quantum dot layer 24.

In a case where the quantum dots 28 are formed of a material that does not contain cadmium, the electron affinity tends to be reduced as compared with a case where the quantum dots 28 are formed of a material that contains cadmium. In particular, when the particle size of the quantum dots 28 is reduced such that the luminescent color of the light-emitting element 20 is green color or blue color, which is a short wavelength, the energy band at the bottom of the conduction band is displaced, and the electron affinity is further reduced. Due to this effect, there is a high possibility that the electron affinity of the quantum dot layer 24 becomes smaller than that of the first electron transport layer 25. Accordingly, the barrier to electrons in the direction from the first electron transport layer 25 toward the quantum dot layer 24 increases. As a result, electrons transported from the first electron transport layer 25 to the quantum dot layer 24 decreases. When the number of electrons supplied in the quantum dot layer 24 decreases, the recombination rate between the positive holes and electrons is reduced and the luminous efficiency decreases.

For example, similar to the electron transport layer 85 of the comparative example, when ZnO, which is a common material, is used in the first electron transport layer 25, the electron affinity of the first electron transport layer 25 is 3.8 eV. In contrast, in a case where the light-emitting elements 20 of three primary colors are configured by the quantum dot layer 24 using InP as the quantum dots 28 that do not contain cadmium, the numerical range of the electron affinity of the quantum dot layer 24 is from 2.5 eV to 3.1 eV. Thus, in a case where the material of the first electron transport layer 25 is ZnO, the injection barrier to electrons increases to from 0.7 to 1.3 eV in the direction from the first electron transport layer 25 toward the quantum dot layer 24, and the luminous efficiency of the quantum dot layer 24 decreases.

In contrast, in a case where $ZnM_2O_4$ is used as the material of the quantum dots 28 of the first electron transport layer 25, the numerical range of the electron affinity of the first electron transport layer 25 in the example 1-1 to the example 1-11 is from 2.26 to 2.60 eV as illustrated in FIG. 4. Thus, the difference between the electron affinity of the quantum dot layer 24 and the electron affinity of the first electron transport layer 25 is at most 0.1 eV, and the difference is smaller than that in the case where ZnO is used in the first electron transport layer 25. Thus, the barrier to electrons between the quantum dot layer 24 and the first electron transport layer 25 is reduced, and electrons injected from the negative electrode 27 into the first electron transport layer 25 can be efficiently injected from the first electron transport layer 25 into the quantum dot layer 24. As a result, the recombination rate between electrons and positive holes in the quantum dots 28 is improved, and the luminous efficiency of the quantum dot layer 24 can be improved. As described above, the first electron transport layer 25 of the present embodiment is suitable for the quantum dots 28 using the material that does not contain cadmium.

Second Embodiment

A light-emitting element 20 according to the second embodiment differs from the light-emitting element 20 according to the first embodiment in that a composition ratio of the elements included in the constituent elements M of the first electron transport layer 25 changes in the layering direction of the light-emitting element 20. The structure of the light-emitting element 20 according to the second embodiment is the same as the structure of the light-emitting element 20 according to the first embodiment described with reference to FIG. 2.

The first electron transport layer 25 included in the light-emitting element 20 according to the second embodiment may be formed of a single layer or may be formed of a plurality of layers, and the composition ratio of Co, Rh, and Ir included in the constituent elements M within the layer of the first electron transport layer 25 differs between the side close to the quantum dot layer 24 and the side close to the negative electrode 27. Specifically, the ionization potential of the first electron transport layer 25 gradually increases from the side close to the quantum dot layer 24 toward the side close to the negative electrode 27. For example, in the light-emitting element 20 of the second embodiment, the composition of the first electron transport layer 25 is $Zn(Co_xRh_yIr_z, 0 \le x \le 1, 0 \le y+z \le 1-x)_2O_4$, and the Co composition x increases from the quantum dot layer 24 toward the negative electrode 27 side.

As a result, the ionization potential of the first electron transport layer 25 increases from the quantum dot layer 24 toward the negative electrode 27. Thus, the positive holes injected into the quantum dot layer 24 can be more reliably prevented from flowing out from the quantum dot layer 24 to the negative electrode 27 side through the first electron transport layer 25. As a result, a reduction in luminous efficiency in the quantum dot layer 24 can be suppressed. Hereinafter, an example 2, which is an example of the second embodiment, will be described in detail.

Example 2

Figure 6:
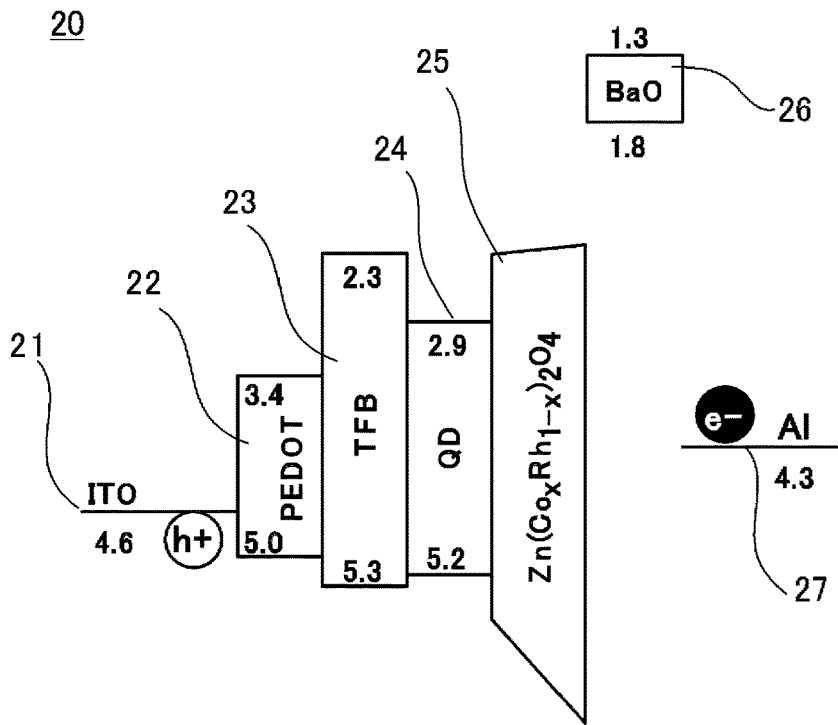
FIG. 6 is an energy diagram illustrating an example of electron affinity and ionization potential of each layer between a positive electrode and a negative electrode of a light-emitting element according to an example 2.

FIG. 6 is an energy diagram illustrating an example of the electron affinity and the ionization potential of each layer between the positive electrode 21 and the negative electrode 27 of the light-emitting element 20 according to the example 2. Note that in FIG. 6, each of the work functions (in eV) of the positive electrode 21 and the negative electrode 27 is expressed by a numerical value. As illustrated in FIG. 6, the light-emitting element 20 in which the first electron transport layer 25 was formed using the compound $Zn(Co_xRh_{1-x})_2O_4$ was prepared. Other configuration and materials of the light-emitting element 20 according to the example 2 are the same as those of the light-emitting element 20 according to the example 1-1.

In the example 2, the light-emitting element 20 was prepared in which the first electron transport layer 25 was formed by setting the composition of the first electron transport layer 25 such that, of the compound $Zn(Co_xRh_{1-x})_2O_4$, the side in contact with the quantum dot layer 24 is x=0, and the side in contact with the second electron transport layer 26 is x=1. Specifically, the first electron transport layer 25 was formed such that the compound $Zn(Co_xRh_{1-x})_2O_4$ in the composition of the first electron transport layer 25 increased from the side close to the quantum dot layer 24, to the side close to the second electron transport layer 26. According to this configuration, the compound $Zn(Co_xRh_{1-x})_2O_4$ of the first electron transport layer 25 had a composition of $ZnRh_2O_4$ on the side in contact with the quantum dot layer 24, and a composition of $ZnCo_2O_4$ on the side in contact with the second electron transport layer 26. In the middle of them, the composition was $Zn(Co·Rh)O_4$. The electron affinity and the ionization potential of the first electron transport layer 25 changed from a value for $ZnRh_2O_4$ to a value for $ZnCo_2O_4$. Specifically, the electron affinity of the first electron transport layer 25 was 2.5 eV on the quantum dot layer 24 side, and 2.4 eV on the second electron transport layer 26 side, and in the middle of them, the electron affinity was decreased. The ionization potential of the first electron transport layer 25 was 5.6 eV on the quantum dot layer 24 side, and 6.6 eV on the second electron transport layer 26 side, and in the middle of them, the ionization potential was increased.

As described above, in the light-emitting element 20 of the example 2, the ionization potential of the first electron transport layer 25 gradually increases from the quantum dot layer 24 toward the negative electrode 27. Thus, the positive holes injected into the quantum dot layer 24 could be more reliably prevented from flowing out from the quantum dot layer 24 to the negative electrode 27 side through the first electron transport layer 25. As a result, the luminous efficiency of the quantum dot layer 24 was further improved.

Third Embodiment

A light-emitting element 20 according to the third embodiment is the same as the light-emitting element 20 according to the second embodiment in that the composition ratio of the elements included in the constituent elements M of the first electron transport layer 25 changes in the layering direction of the light-emitting element 20, but differs from the light-emitting element 20 according to the second embodiment in that the first electron transport layer 25 is formed of a plurality of layers, and the ionization potential of the first electron transport layer 25 stepwisely increases from the side close to the quantum dot layer 24 toward the side close to the negative electrode 27. The structure of the light-emitting element 20 according to the third embodiment is the same as the structure of the light-emitting element 20 according to the first embodiment described with reference to FIG. 2 except for the first electron transport layer 25.

The first electron transport layer 25 in the light-emitting element 20 according to the third embodiment includes, for example, a first layer, a second layer, and a third layer, which are a plurality of layers sequentially layered from the quantum dot layer 24 toward the negative electrode 27 side, and the first layer, the second layer, and the third layer are different from each other in the composition of Co, Rh, and Ir included in the constituent elements M. As a result, the ionization potential of the first electron transport layer 25 stepwisely increases in the order of the first layer, the second layer, and the third layer.

For example, the first electron transport layer 25 including the plurality of layered layers according to the third embodiment is formed of n layers each having a composition different from each other. Of the layers forming the first electron transport layer 25, a layer in contact with the quantum dot layer 24 is referred to as a first, and a layer furthest away from the quantum dot layer 24 is referred to as an n-th. A composition of each layer forming the n layers is expressed by $Zn(Co_{xn}Rh_{yn}Ir_{zn},\ 0 \le xn \le 1,\ 0 \le yn+zn \le 1-xn)_2O_4$. An Ir composition of the first layer of the first electron transport layer 25 including the plurality of layered layers in contact with the quantum dot layer 24, may be set to be the highest, and a relationship between the Ir composition in each layer may be set to $y1 \le yn\ (n \ne 1)$.

According to the light-emitting element 20 according to the third embodiment, the ionization potential of each of the layers included in the first electron transport layer 25 stepwisely increases in the direction from the side of the quantum dot layer 24 toward the negative electrode 27. Thus, the positive holes injected from the positive electrode 21 into the quantum dot layer 24 can be more reliably prevented from flowing out from the quantum dot layer 24 to the negative electrode 27 through the first electron transport layer 25. As a result, a reduction in luminous efficiency in the quantum dot layer 24 can be suppressed.

Note that the layers forming the first electron transport layer 25 is not limited to three layers, and may be any number. For example, the first electron transport layer 25 may be two layers or four layers or more. Hereinafter, an example 3, which is an example of the third embodiment, will be described in detail.

Example 3

Figure 7:
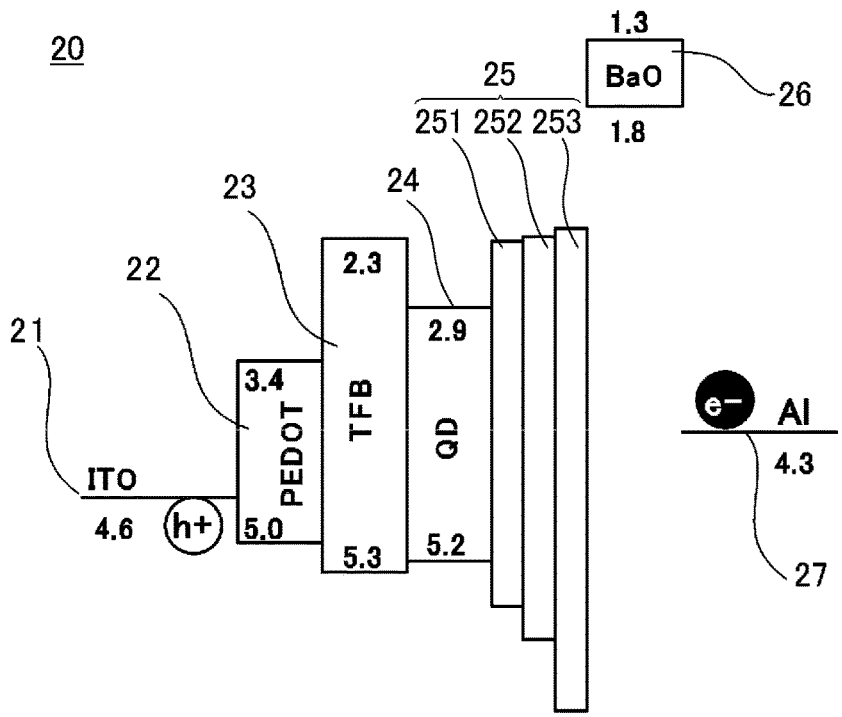
FIG. 7 is an energy diagram illustrating an example of electron affinity and ionization potential of each layer between a positive electrode and a negative electrode of the light-emitting element according to an example 3.

FIG. 7 is an energy diagram illustrating an example of the electron affinity and the ionization potential of each layer between the positive electrode 21 and the negative electrode 27 of the light-emitting element 20 according to the example 3. Note that in FIG. 7, each of the work functions (in eV) of the positive electrode 21 and the negative electrode 27 is expressed by a numerical value. As illustrated in FIG. 7, the first electron transport layer 25 is formed by layering a first layer 251, a second layer 252, and a third layer 253, which are a plurality of layers sequentially layered in order from the quantum dot layer 24 toward the negative electrode 27, whereby the light-emitting element 20 was prepared. In the light-emitting element 20 according to the example 3, a configuration and materials except for the first electron transport layer 25 are the same as those of the light-emitting element 20 according to the example 1-1.

The first electron transport layer 25 was a three-layer structure of the first layer 251, the second layer 252, and the third layer 253, where the first layer 251 was formed using $ZnRh_2O_4$, the second layer 252 was formed using $Zn(Co·Rh)O_4$, and the third layer 253 was formed using $ZnCo_2O_4$. As a result, the first layer 251 had the ionization potential of 5.6 eV and the electron affinity of 2.5 eV. The second layer 252 had the ionization potential of 6.6 eV and the electron affinity of 2.45 eV. The third layer 253 had the ionization potential of 6.6 eV and the electron affinity of 2.4 eV. Thus, the ionization potential of each of the first layer 251, the second layer 252, and the third layer 253 stepwisely increased in the direction from the side of the quantum dot layer 24 toward the negative electrode 27. Thus, the positive holes injected from the positive electrode 21 into the quantum dot layer 24 can be more reliably prevented from flowing out from the quantum dot layer 24 to the negative electrode 27 through the first electron transport layer 25. As a result, the luminous efficiency in the quantum dot layer was further improved.

The disclosure is not limited to the embodiments described above. Embodiments obtained by modifying above-described embodiments and embodiments obtained by appropriately combining technical approaches disclosed in above-described embodiments also fall within the scope of the technology of the disclosure.

The invention claimed is:

1. A light-emitting element comprising:
   a positive electrode;
   a negative electrode;
   a quantum dot layer provided between the positive electrode and the negative electrode and including quantum dots; and
   a first electron transport layer provided to be in contact with the quantum dot layer and between the quantum dot layer and the negative electrode and containing a compound formed of Zn, O, and constituent elements M, the constituent elements M including two or more elements of Co, Rh, and Ir.

* * * * *